United States Patent
Grossinger et al.

(10) Patent No.: US 11,949,213 B2
(45) Date of Patent: Apr. 2, 2024

(54) VCSEL ARRAYS FOR GENERATION OF LINEAR STRUCTURED LIGHT FEATURES

(71) Applicant: META PLATFORMS TECHNOLOGIES, LLC, Menlo Park, CA (US)

(72) Inventors: Nadav Grossinger, Foster City, CA (US); Michael Hall, Bellevue, WA (US); Robert Hasbun, San Jose, CA (US); Jonatan Ginzburg, Sunnyvale, CA (US); Zihe Gao, Redmond, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 768 days.

(21) Appl. No.: 17/069,731

(22) Filed: Oct. 13, 2020

(65) Prior Publication Data

US 2022/0013991 A1    Jan. 13, 2022

Related U.S. Application Data

(60) Provisional application No. 63/049,256, filed on Jul. 8, 2020.

(51) Int. Cl.
*H01S 5/42* (2006.01)
*G01S 17/89* (2020.01)
(Continued)

(52) U.S. Cl.
CPC .............. *H01S 5/423* (2013.01); *G01S 17/89* (2013.01); *G02B 27/0172* (2013.01); *G06T 7/521* (2017.01); *H04N 13/271* (2018.05)

(58) Field of Classification Search
CPC ...................................................... H01S 5/423
See application file for complete search history.

(56) References Cited

U.S. PATENT DOCUMENTS

2015/0180207 A1*  6/2015  Kaneko ............... H01S 5/04254
                                                                    372/92
2016/0072258 A1    3/2016  Seurin et al.
(Continued)

FOREIGN PATENT DOCUMENTS

FR          2932562 A1      12/2009
WO      2019216828 A1      11/2019

OTHER PUBLICATIONS

International Search Report and Written Opinion for International Application No. PCT/US2021/035550, dated Aug. 20, 2021, 16 Pages.

(Continued)

*Primary Examiner* — Diane D Mizrahi
(74) *Attorney, Agent, or Firm* — Morgan, Lewis & Bockius LLP

(57) ABSTRACT

A depth camera assembly (DCA) determines depth information for a local area. The DCA includes a camera assembly and at least one illuminator. The DCA may select a subset of the VCSELs to provide illumination at any given time. The illuminator may comprise near-field VCSELs configured to generate a structured light (SL) pattern for depth sensing in the near-field and far-field VCSELs configured to generate a SL pattern for depth sensing in the far-field. The near-field VCSELs may comprise a linear emission region which is shorter than a linear emission region of the far-field VCSELs. The DCA may generate and phase shift a quasi-sinusoidal SL pattern. The DCA may phase shift the quasi-sinusoidal SL pattern by alternating which traces on the illuminator are active.

19 Claims, 12 Drawing Sheets

(51) Int. Cl.
*G02B 27/01* (2006.01)
*G06T 7/521* (2017.01)
*H04N 13/271* (2018.01)

(56) References Cited

U.S. PATENT DOCUMENTS

| | | |
|---|---|---|
| 2018/0301871 A1 | 10/2018 | Dummer et al. |
| 2020/0067278 A1 | 2/2020 | Han et al. |
| 2023/0085063 A1* | 3/2023 | Ginzburg ............... G01B 11/22 356/4.01 |

OTHER PUBLICATIONS

International Preliminary Report on Patentability for International Application No. PCT/US2021/035550, dated Jan. 19, 2023, 13 pages.

* cited by examiner

VCSEL ARRAYS FOR GENERATION OF LINEAR STRUCTURED LIGHT FEATURES

CROSS-REFERENCE TO RELATED APPLICATIONS

This application claims the benefit of U.S. Provisional Application No. 63/049,256, filed on Jul. 8, 2020, which is incorporated by reference in its entirety.

FIELD OF THE INVENTION

This disclosure relates generally to depth determination systems, and more specifically to vertical cavity surface emitting laser (VCSEL) arrays for generation of linear structured light features.

BACKGROUND

Depth sensing systems determine depth information describing a local area. Depth sensing systems may utilize an illuminator that projects structured light (SL) patterns into the local area. However, the desirable properties of the SL pattern may be different for objects in the near-field versus objects in the far-field. Additionally, design limitations of VCSEL chips may limit the density of VCSELs on the chip.

SUMMARY

A depth camera assembly (DCA) determines depth information for a local area. The DCA includes at least one camera and at least one illuminator. The illuminator comprises an array of vertical cavity surface emitting lasers VCSELs. The DCA may select a subset of the VCSELs to provide illumination at any given time. The illuminator may comprise near-field VCSELs configured to generate a structured light (SL) pattern for depth sensing in the near-field and far-field VCSELs configured to generate a SL pattern for depth sensing in the far-field. The near-field VCSELs comprise a linear emission region having a length and a width. The length of the near-field VCSELs may be shorter than a length of the linear emission region of the far-field VCSELs. The DCA may generate a quasi-sinusoidal SL pattern. The DCA may phase shift the quasi-sinusoidal SL pattern by changing which traces on the illuminator are active.

In some embodiments, a VCSEL array may comprise one or more first linear VCSELs on a substrate. Each of the one or more first linear VCSELs has a respective linear emission region over a first length. The VCSEL array may comprise one or more second linear VCSELs on the substrate. Each of the one or more second linear VCSELs have a linear emission region over a second length that is longer than the first length, wherein the linear emission region of at least one second linear VCSEL of the one or more second linear VCSELs is parallel to an adjacent linear emission region of a respective first linear VCSEL of the one or more first linear VCSELs.

In some embodiments, a vertical cavity surface emitting laser (VCSEL) array may comprise a first plurality of emitters each having an emission region of a first shape. The first plurality of emitters are positioned on a substrate to emit light that forms a structured light (SL) pattern at a first phase shift in a far-field of the VCSEL array, and the SL pattern has a quasi-sinusoidal distribution in at least one dimension that is based in part on positions of the first plurality of emitters on the substrate and the first shape of each emission region of each of the first plurality of emitters. The VCSEL array may comprise a second plurality of emitters each having an emission region of the first shape. The second plurality of emitters are positioned on the substrate to emit light that forms the SL pattern in the far-field at a second phase shift that is different than the first phase shift, and the quasi-sinusoidal distribution of the SL pattern at the second phase shift is based in part on positions of the second plurality of emitters on the substrate and the first shape of each emission region of each of the second plurality of emitters.

Figure 1A:
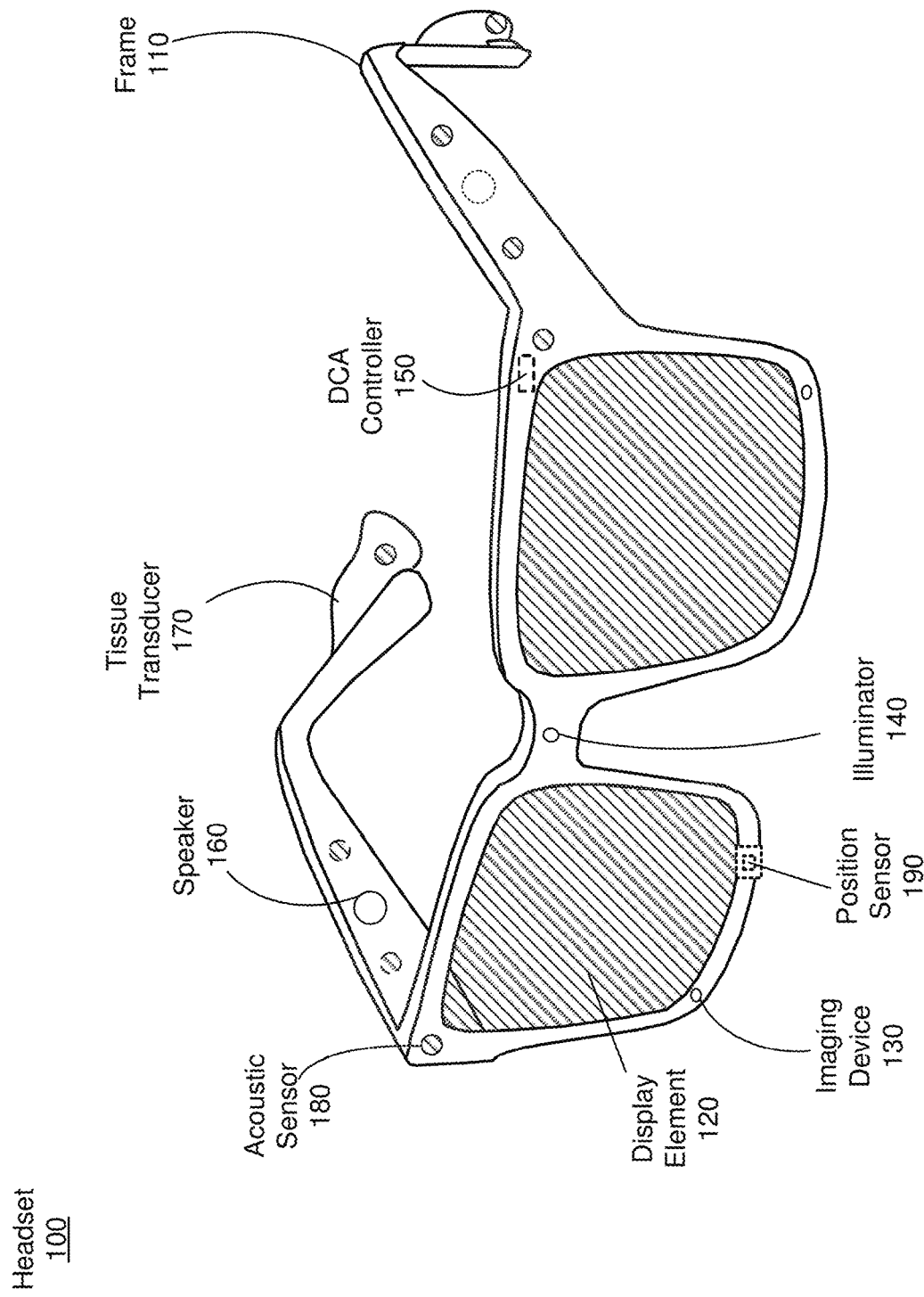
FIG. 1A is a perspective view of a headset implemented as an eyewear device, in accordance with one or more embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

A depth camera assembly (DCA) determines depth information for a local area. The DCA includes a plurality of cameras and at least one illuminator. The illuminator comprises an array of VCSELs. The DCA may select a subset of the VCSELs to provide illumination at any given time.

In some embodiments, the illuminator comprises near-field VCSELs configured to generate a structured light (SL) pattern for depth sensing in the near-field and far-field VCSELs configured to generate a SL pattern for depth sensing in the far-field. The near-field comprises objects closer than a threshold distance to the DCA, and the far-field comprises objects farther than the threshold distance to the DCA. The near-field VCSELs may comprise respective linear emission regions which are shorter than respective linear emission regions of the far-field VCSELs. The DCA may activate the near-field VCSELs to illuminate an object in the near-field. The DCA may activate the far-field VCSELs to illuminate an object in the far-field.

In some embodiments, the DCA is configured to generate and phase shift a quasi-sinusoidal SL pattern. The quasi-sinusoidal SL pattern generally appears as a group of parallel lines within the local area. The illuminator may comprise a plurality of traces, wherein each trace comprises a group of emitters. Each emitter may have a shape configured to emit light having a quasi-sinusoidal distribution. An optical assembly may combine the light emitted by the emitters on a trace into a single line (e.g., bar). The intensity of the single line may be substantially constant along a length of the line. The emitter shapes are such that there is a quasi-sinusoidal intensity distribution from line to line in the quasi-sinusoidal SL pattern. The combination of SL features generated by multiple traces results in a quasi-sinusoidal SL pattern that comprises a plurality of linear maxima (located at each line) separated by minima (located between adjacent lines), where each maximum is generated by the emitters on a single trace. The DCA may phase shift (e.g., to translate the pattern within the local area) the quasi-sinusoidal SL pattern by alternating which traces on the illuminator are active.

The DCA may thus generate SL patterns which increase accuracy while decreasing power consumption. As opposed to depth sensing systems which project SL features at a uniform intensity into a local area, the disclosed DCAs may project light at different intensities into different portions of a local area based on the distances to objects in the local area. Additionally, the disclosed DCA may generate quasi-sinusoidal SL patterns which may be phase-shifted, which may increase the resolution of the obtained depth information in comparison to static SL patterns.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to create content in an artificial reality and/or are otherwise used in an artificial reality. The artificial reality system that provides the artificial reality content may be implemented on various platforms, including a wearable device (e.g., headset) connected to a host computer system, a standalone wearable device (e.g., headset), a mobile device or computing system, or any other hardware platform capable of providing artificial reality content to one or more viewers.

FIG. 1A is a perspective view of a headset 100 implemented as an eyewear device, in accordance with one or more embodiments. In some embodiments, the eyewear device is a near eye display (NED). In general, the headset 100 may be worn on the face of a user such that content (e.g., media content) is presented using a display assembly and/or an audio system. However, the headset 100 may also be used such that media content is presented to a user in a different manner. Examples of media content presented by the headset 100 include one or more images, video, audio, or some combination thereof. The headset 100 includes a frame, and may include, among other components, a display assembly including one or more display elements 120, a depth camera assembly (DCA), an audio system, and a position sensor 190. While FIG. 1A illustrates the components of the headset 100 in example locations on the headset 100, the components may be located elsewhere on the headset 100, on a peripheral device paired with the headset 100, or some combination thereof. Similarly, there may be more or fewer components on the headset 100 than what is shown in FIG. 1A.

The frame 110 holds the other components of the headset 100. The frame 110 includes a front part that holds the one or more display elements 120 and end pieces (e.g., temples) to attach to a head of the user. The front part of the frame 110 bridges the top of a nose of the user. The length of the end pieces may be adjustable (e.g., adjustable temple length) to fit different users. The end pieces may also include a portion that curls behind the ear of the user (e.g., temple tip, ear piece).

The one or more display elements 120 provide light to a user wearing the headset 100. As illustrated the headset includes a display element 120 for each eye of a user. In some embodiments, a display element 120 generates image light that is provided to an eyebox of the headset 100. The eyebox is a location in space that an eye of user occupies while wearing the headset 100. For example, a display element 120 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eyebox of the headset 100. In-coupling and/or outcoupling of light from the one or more waveguides may be done using one or more diffraction gratings. In some embodiments, the waveguide display includes a scanning element (e.g., waveguide, mirror, etc.) that scans light from the light source as it is in-coupled into the one or more waveguides. Note that in some embodiments, one or both of the display elements 120 are opaque and do not transmit light from a local area around the headset 100. The local area is the area surrounding the headset 100. For example, the local area may be a room that a user wearing the headset 100 is inside, or the user wearing the headset 100 may be outside and the local area is an outside area. In this context, the headset 100 generates VR content. Alternatively, in some embodiments, one or both of the display elements 120 are at least partially transparent, such that light from the local area may be combined with light from the one or more display elements to produce AR and/or MR content.

In some embodiments, a display element 120 does not generate image light, and instead is a lens that transmits light from the local area to the eyebox. For example, one or both of the display elements 120 may be a lens without correction (non-prescription) or a prescription lens (e.g., single vision, bifocal and trifocal, or progressive) to help correct for defects in a user's eyesight. In some embodiments, the display element 120 may be polarized and/or tinted to protect the user's eyes from the sun.

In some embodiments, the display element 120 may include an additional optics block (not shown). The optics block may include one or more optical elements (e.g., lens, Fresnel lens, etc.) that direct light from the display element 120 to the eyebox. The optics block may, e.g., correct for aberrations in some or all of the image content, magnify some or all of the image, or some combination thereof.

The DCA determines depth information for a portion of a local area surrounding the headset 100. The DCA includes one or more imaging devices 130, a DCA controller 150, and an illuminator 140. In some embodiments, the illuminator 140 illuminates a portion of the local area with light. The light may be, e.g., structured light (e.g., parallel lines) in the infrared (IR). In some embodiments, the one or more imaging devices 130 capture images of the portion of the local area that include the light from the illuminator 140. As illustrated, FIG. 1A shows a single illuminator 140 and two imaging devices 130.

The illuminator 140 comprises a VCSEL array. The VCSEL array may comprise near-field VCSELs configured to generate SL patterns for depth sensing in the near-field. The VCSEL array may comprise far-field VCSELs configured to generate SL patterns for depth sensing in the far-field as further described with respect to FIGS. 2-6 and 8. The VCSEL array is configured to generate a plurality of linear SL features. The VCSEL array may comprise a plurality of VCSELs configured to generate a quasi-sinusoidal SL pattern, as further described with reference to FIGS. 2, 4, 7, and 9.

The illuminator 140 projects a plurality of SL features, such as lines, that together form the SL pattern. The illuminator 140 may project SL features from the near-field VCSELs into a first portion of the local area and SL features from the far-field VCSELs into a second portion of the local area. In some embodiments, the SL features from multiple VCSELs combine to form the quasi-sinusoidal SL pattern.

The imaging devices 130 capture images of the local area containing the SL pattern. The DCA controller 150 calculates depth information based on distortions of the SL pattern in the images captured by the imaging devices 130. The DCA controller 150 may determine depth to objects in the local area using an initial depth sensing mode, such as TOF, then, based on a calculated depth to the objects, the DCA controller 150 may select VCSELs for activation in the portion of the local area containing the object. For example, the DCA controller 150 may determine using a TOF depth sensing mode that an object is in the near-field, and the DCA controller 150 may instruct the illuminator 140 to activate near-field VCSELs in the portion of the local area containing the object.

The audio system provides audio content. The audio system includes a transducer array, a sensor array, and an audio controller. However, in other embodiments, the audio system may include different and/or additional components. Similarly, in some cases, functionality described with reference to the components of the audio system can be distributed among the components in a different manner than is described here. For example, some or all of the functions of the controller may be performed by a remote server.

The transducer array presents sound to user. The transducer array includes a plurality of transducers. A transducer may be a speaker 160 or a tissue transducer 170 (e.g., a bone conduction transducer or a cartilage conduction transducer). Although the speakers 160 are shown exterior to the frame 110, the speakers 160 may be enclosed in the frame 110. In some embodiments, instead of individual speakers for each ear, the headset 100 includes a speaker array comprising multiple speakers integrated into the frame 110 to improve directionality of presented audio content. The tissue transducer 170 couples to the head of the user and directly vibrates tissue (e.g., bone or cartilage) of the user to generate sound. The number and/or locations of transducers may be different from what is shown in FIG. 1A.

The sensor array detects sounds within the local area of the headset 100. The sensor array includes a plurality of acoustic sensors 180. An acoustic sensor 180 captures sounds emitted from one or more sound sources in the local area (e.g., a room). Each acoustic sensor is configured to detect sound and convert the detected sound into an electronic format (analog or digital). The acoustic sensors 180 may be acoustic wave sensors, microphones, sound transducers, or similar sensors that are suitable for detecting sounds.

In some embodiments, one or more acoustic sensors 180 may be placed in an ear canal of each ear (e.g., acting as binaural microphones). In some embodiments, the acoustic sensors 180 may be placed on an exterior surface of the headset 100, placed on an interior surface of the headset 100, separate from the headset 100 (e.g., part of some other device), or some combination thereof. The number and/or locations of acoustic sensors 180 may be different from what is shown in FIG. 1A. For example, the number of acoustic detection locations may be increased to increase the amount of audio information collected and the sensitivity and/or accuracy of the information. The acoustic detection locations may be oriented such that the microphone is able to detect sounds in a wide range of directions surrounding the user wearing the headset 100.

An audio controller processes information from the sensor array that describes sounds detected by the sensor array. The audio controller may comprise a processor and a computer-readable storage medium. The audio controller may be configured to generate direction of arrival (DOA) estimates, generate acoustic transfer functions (e.g., array transfer functions and/or head-related transfer functions), track the location of sound sources, form beams in the direction of sound sources, classify sound sources, generate sound filters for the speakers 160, or some combination thereof.

The position sensor 190 generates one or more measurement signals in response to motion of the headset 100. The position sensor 190 may be located on a portion of the frame 110 of the headset 100. The position sensor 190 may include an inertial measurement unit (IMU). Examples of position sensor 190 include: one or more accelerometers, one or more gyroscopes, one or more magnetometers, another suitable type of sensor that detects motion, a type of sensor used for error correction of the IMU, or some combination thereof. The position sensor 190 may be located external to the IMU, internal to the IMU, or some combination thereof.

In some embodiments, the headset 100 may provide for simultaneous localization and mapping (SLAM) for a position of the headset 100 and updating of a model of the local area. For example, the headset 100 may include a passive camera assembly (PCA) that generates color image data. The PCA may include one or more RGB cameras that capture images of some or all of the local area. In some embodiments, some or all of the imaging devices 130 of the DCA may also function as the PCA. The images captured by the PCA and the depth information determined by the DCA may be used to determine parameters of the local area, generate a model of the local area, update a model of the local area, or some combination thereof. Furthermore, the position sensor 190 tracks the position (e.g., location and pose) of the headset 100 within the room. Additional details regarding the components of the headset 100 are discussed below in connection with FIG. 6.

Figure 1B:
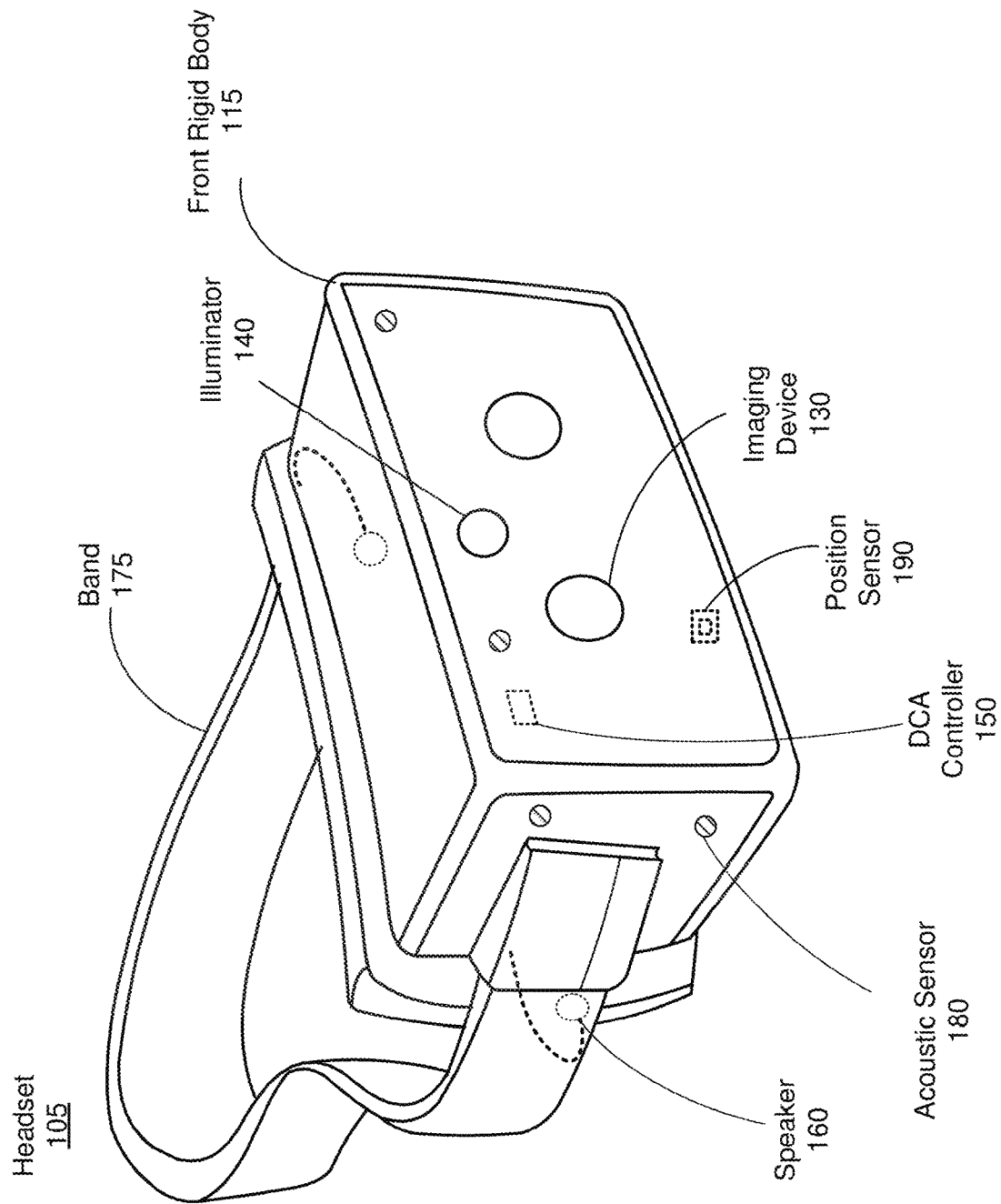
FIG. 1B is a perspective view of a headset implemented as a head-mounted display, in accordance with one or more embodiments.

FIG. 1B is a perspective view of a headset 105 implemented as a HMD, in accordance with one or more embodiments. In embodiments that describe an AR system and/or a MR system, portions of a front side of the HMD are at least partially transparent in the visible band (~380 nm to 750 nm), and portions of the HMD that are between the front side of the HMD and an eye of the user are at least partially transparent (e.g., a partially transparent electronic display). The HMD includes a front rigid body 115 and a band 175. The headset 105 includes many of the same components described above with reference to FIG. 1A, but modified to integrate with the HMD form factor. For example, the HMD includes a display assembly, a DCA, an audio system, and a position sensor 190. FIG. 1B shows the illuminator 140, the DCA controller 150, a plurality of the speakers 160, a plurality of the imaging devices 130, a plurality of acoustic sensors 180, and the position sensor 190. The illuminator 140 is configured to generate SL patterns for depth sensing in the near-field and SL patterns for depth sensing in the far-field. The illuminator 140 may be configured to generate quasi-sinusoidal SL patterns.

Figure 2:
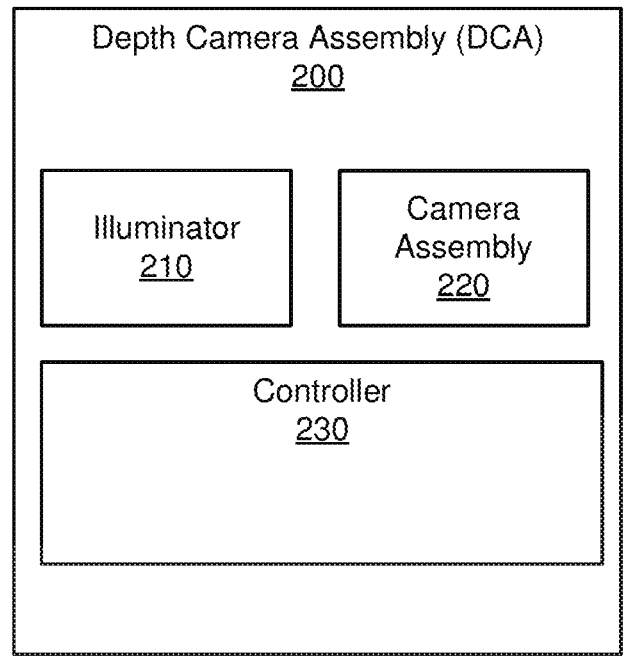
FIG. 2 is a block diagram of a DCA, in accordance with one or more embodiments.

FIG. 2 is a block diagram of a DCA 200, in accordance with one or more embodiments. The DCA of FIG. 1A and FIG. 1B may be an embodiment of the DCA 200. The DCA 200 is configured to obtain depth information of a local area surrounding the DCA 200. For example, the DCA 200 may be configured to detect the location of objects in a room. The DCA 200 comprises an illuminator 210, a camera assembly 220, and a DCA controller 230. Some embodiments of the DCA 200 have different components than those described here. Similarly, in some cases, functions can be distributed among the components in a different manner than is described here.

The illuminator 210 is configured to project light into the local area. The illuminator 140 of FIG. 1A and FIG. 1B may be an embodiment of the illuminator 210. The light may be, e.g., SL pattern (e.g., lines) in the infrared (IR). The SL pattern may comprise a quasi-sinusoidal distribution of linear SL features. For example, a SL feature may be a line of a group of parallel lines that make up the SL pattern. A quasi-sinusoidal distribution includes alternating maxima and minima, with a gradient in between. The projected light reflects off objects in the local area, and a portion of the reflected light is detected by the camera assembly 220. The illuminator 210 comprises a VCSEL array and an optical assembly.

The VCSEL array is configured to emit light in accordance with instructions from the DCA controller 230. The VCSEL array comprises a plurality of VCSELs on a chip. Some or all of the VCSELs may be individually activated. Each VCSEL comprises an emission region. The emission regions may be linear emission regions. The emission regions have a length and a width. The length of the linear emission region is longer than the width. The VCSEL array may include a first group of far-field VCSELs and a second group of near-field VCSELs. Respective linear emission regions of the first group of far-field VCSELs are longer than respective linear emission regions of the second group of near-field VCSELs. In some embodiments, the VCSEL array may comprises any suitable number of different lengths of emission regions of respective VCSELs. VCSEL arrays with linear emission regions are discussed in detail below with regard to, e.g., FIGS. 4-6.

The intensity of light emitted by a VCSEL may be a function of the area of the emission region of the VCSEL. The far-field VCSELs comprising relatively long lengths may emit light at a greater intensity than the near-field VCSELs comprising emission regions of relatively short lengths. The far-field VCSELs may be activated for depth sensing in the far-field, where a higher intensity of SL features is desired. The near-field VCSELs may be activated for depth sensing in the near-field, where DCA 200 may utilize a lower intensity of SL features. As used herein, the "far-field" refers to distances greater than a threshold distance from the DCA 200. As used herein, the "near-field" refers to distances less than the threshold distance from the DCA 200. In some embodiments, the threshold distance may be approximately 2 meters, or between 1-5 meters.

In some embodiments, the VCSEL array may comprise quasi-sinusoidal emitters, for which the width of the emission region may vary over a length of the emission region, such that the VCSELs are configured to emit light for generating a quasi-sinusoidal SL pattern in the local area. The quasi-sinusoidal emitters are configured to emit light in a quasi-sinusoidal distribution. In some embodiments, each quasi-sinusoidal emitter comprises a first narrow end, a wide central section, and a second narrow end. The quasi-sinusoidal emitters may be symmetrical about an axis. In some embodiments, the axis may be angled at forty-five degrees relative to the length of a trace on which the emitter is disposed. A width of the emitter varies at different positions across the length of the emitter. The width may vary as a function of the length in a quasi-sinusoidal distribution. VCSEL arrays with quasi-sinusoidal emitters are discussed in detail below with regard to, e.g., FIGS. 7A-B.

The quasi-sinusoidal emitters are configured to emit light for a quasi-sinusoidal SL pattern. The quasi-sinusoidal emitters may be arranged in groups on traces of the VCSEL. Each trace may comprise a plurality of quasi-sinusoidal emitters. A trace may generate a linear SL feature having a quasi-sinusoidal intensity distribution, such that an intensity of the linear SL feature is substantially constant along a length of the SL feature and varies in a quasi-sinusoidal distribution in a direction perpendicular to the length of the SL feature (i.e., between adjacent lines in the SL pattern). The quasi-sinusoidal intensity distribution may comprise alternating maxima and minima between SL features generated by different traces. The intensity distribution may have a gradient between the maxima and the minima. For example, the gradient perpendicular to the length of the linear SL feature may be a sine wave, a triangle wave, a gaussian distribution centered on each SL feature, some other gradient pattern, or some combination thereof. In some embodiments, one or more of the plurality of emitters have varying shapes of the emission regions (e.g., diamond, triangle, rectangle, sinusoidal, etc.) relative to other emitters of the plurality of emitters.

The optical assembly is configured to condition the light emitted by the VCSEL array. The optical assembly may comprise one or more lenses, diffractive optical elements, or some combination thereof. The optical assembly may expand the light emitted by each VCSEL. For example, for a linear VCSEL, the optical assembly may increase the length of the line of light emitted by the VCSEL, such that the light emitted by the VCSEL results in a line across the field of view of the DCA 200. The optical assembly may tile the light emitted by the VCSEL array, such that the structured light pattern emitted by the VCSEL array is repeated in multiple locations.

In some embodiments, the optical assembly may condition the light from the VCSEL array and project a quasi-sinusoidal SL pattern into the local area. The optical assembly may expand the light emitted by each emitter into a line. The light emitted by multiple emitters on a trace may be combined into a single line. The line may have a constant intensity or a substantially constant intensity along the length of the line. In a direction perpendicular do the length of the line (i.e., between adjacent lines), the intensity may vary based on the shapes of the emitters. The optical assembly conditions the light emitted by the emitters on multiple traces to form the quasi-sinusoidal SL pattern.

The camera assembly 220 is configured to capture light from the local area in accordance with instructions from the DCA controller 230. The imaging devices 130 of FIG. 1A and FIG. 1B may be embodiments of the camera assembly 220. The camera assembly comprises one or more cameras, and each camera may comprise one or more sensors. In some embodiments, each sensor may comprise a charge-coupled device (CCD) or a complementary metal-oxide-semiconductor (CMOS). Each sensor comprises a plurality of pixels. Each pixel is configured to detect photons incident on the pixel. The pixels are configured to detect a narrow bandwidth of light including the wavelength of the light projected by the illuminator 210. Each pixel may correspond to a distinct direction relative to the sensor.

The DCA controller 230 is configured to provide instructions to the various components of the DCA 200 and calculate depth information for the local area. The DCA controller 150 of FIG. 1A and FIG. 1B may be an embodiment of the DCA controller 230. Some embodiments of the DCA controller 230 have different components than those described here. Similarly, in some cases, functions can be distributed among the components in a different manner than is described here.

The DCA controller 230 is configured to generate instructions for the illuminator 210 to emit light into the local area. The DCA controller 230 may generate instructions to activate the near-field VCSELs, the far-field VCSELs, or some combination thereof. The DCA controller 230 may determine that near-field depth sensing is suitable for a portion of the local area, and the DCA controller 230 may generate instructions to activate the near-field VCSELs. For example, the DCA controller 230 may determine that an object is located within the near-field based on an initial depth measurement by the DCA 200, based on depth information obtained from a mapping server, or some combination thereof. The DCA controller 230 may determine that far-field depth sensing is suitable for a portion of the local area, and the DCA controller 230 may generate instructions to activate the far-field VCSELs.

The DCA controller 230 generates instructions for the illuminator 210 to project SL patterns into the local area. The DCA controller 230 may instruct the illuminator 210 to project different SL patterns into different portions of the local area based on distances to the objects in the local area. The SL pattern may be a quasi-sinusoidal SL pattern. The DCA controller 230 may phase shift the quasi-sinusoidal SL pattern by alternating which traces are activated. A phase shift results in a translation of the SL pattern in the local area (e.g., the lines shift to the left). The DCA controller 230 may phase shift the quasi-sinusoidal SL pattern by generating instructions that cause the illuminator 210 to laterally shift the active traces on the illuminator. For example, the DCA controller 230 may instruct the illuminator 210 to activate a first set of traces comprising every third trace during a first time period. The DCA controller 230 may phase shift the quasi-sinusoidal SL pattern by 120 degrees by instructing the illuminator 210 to activate a second set of traces. The second set of traces may comprise every third trace but shifted by one trace relative to the first set of traces. The DCA controller 230 may phase shift the quasi-sinusoidal SL pattern by an additional 120 degrees by activating a third set of traces. The third set of traces may comprise every third trace but shifted by one trace relative to the second set of traces. Thus, the DCA controller 230 may instruct the illuminator 210 to alternately generate three quasi-sinusoidal SL patterns which are each phase-shifted from one another. In some embodiments, a set of traces may comprise every second trace, every third trace, every fourth trace, every fifth trace, any other suitable combination of traces, or some combination thereof, such that the quasi-sinusoidal SL patterns may be phase shifted by different amounts.

The DCA controller 230 is configured to generate instructions for the camera assembly 220 to obtain depth information. The DCA controller 230 is configured to calculate depth information based on the information obtained by the camera assembly 220. The DCA controller 230 may obtain depth measurements using a depth sensing mode. The depth sensing mode may be TOF depth sensing, SL depth sensing, passive stereo depth sensing, active stereo depth sensing, structured stereo depth sensing, or some combination thereof. In some embodiments, the DCA controller 230 obtains depth information without illumination of the local area using a passive stereo depth sensing mode. The depth controller 230 may identify regions of the local area to illuminate based on locations of detected objects in the local area.

The DCA controller 230 provides the generated instructions to the illuminator 210 and the camera assembly 220. The instructions instruct the illuminator 210 to project light into the local area. The instructions instruct the camera assembly 220 to capture images of the local area containing the projected light.

The DCA controller 230 calculates depth information based on the images captured by the camera assembly 220. The depth information may be calculated using a variety of depth sensing modes, including TOF depth sensing, SL depth sensing, passive stereo depth sensing, active stereo depth sensing, structured stereo depth sensing, or some combination thereof. The DCA controller 230 may store the depth information in a depth model.

Figure 3:
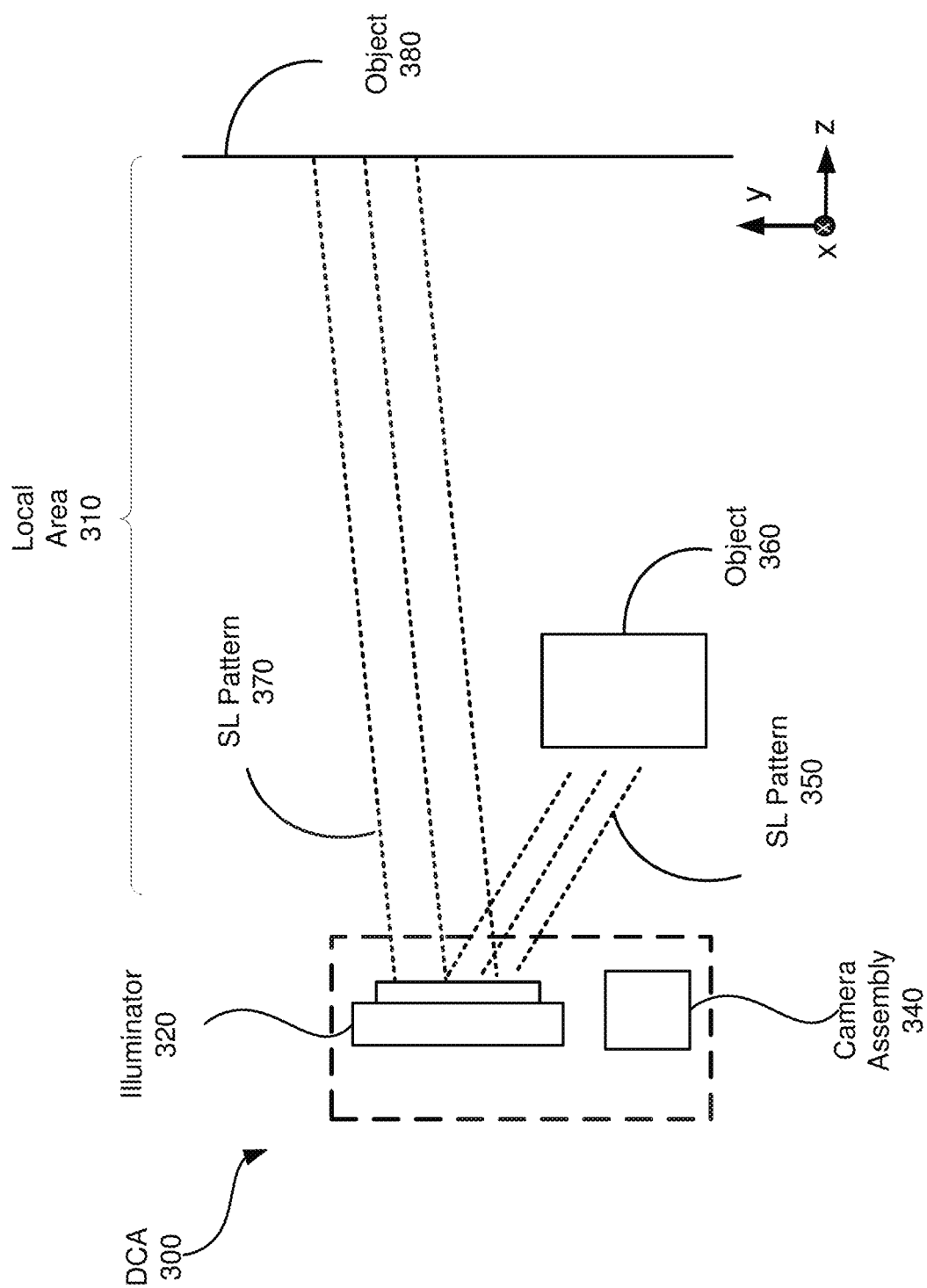
FIG. 3 is a schematic diagram of a DCA in a local area, in accordance with one or more embodiments.

FIG. 3 is a schematic diagram of a DCA 300 obtaining depth information in a local area 310, in accordance with one or more embodiments. The DCA 300 may be an embodiment of the DCA 200 of FIG. 2. The DCA 300 comprises an illuminator 320. The illuminator 320 may be an embodiment of the illuminator 210 of FIG. 2. The DCA 300 may project a SL pattern toward an object 360 and/or an object 380 in a local area of the DCA 300. As illustrated in FIG. 3, the object 360 is in a near-field, and the object 380 is in a far-field. The object 360 may be a hand of a user of a headset. The DCA 300 may project a SL pattern 350 toward the object 360. The SL pattern 350 may be generated by near-field VCSELs on the illuminator 320.

The DCA 300 may project a SL pattern 370 toward the object 380 in the far-field. The SL pattern 370 may be generated by the illuminator 320 using far-field VCSELs on the illuminator 320. The activated VCSELs may be selected based on a distance to the illuminated object. For example, if the object 380 is located in the far-field, the illuminator 320 may activate the far-field VCSELs. An object may be determined to be in the far-field if it is greater than a threshold distance from the DCA 300. In some embodiments, the threshold distance may be approximately 2 meters. The DCA 300 may project different SL patterns into different portions of the local area 310 simultaneously.

Figure 4:
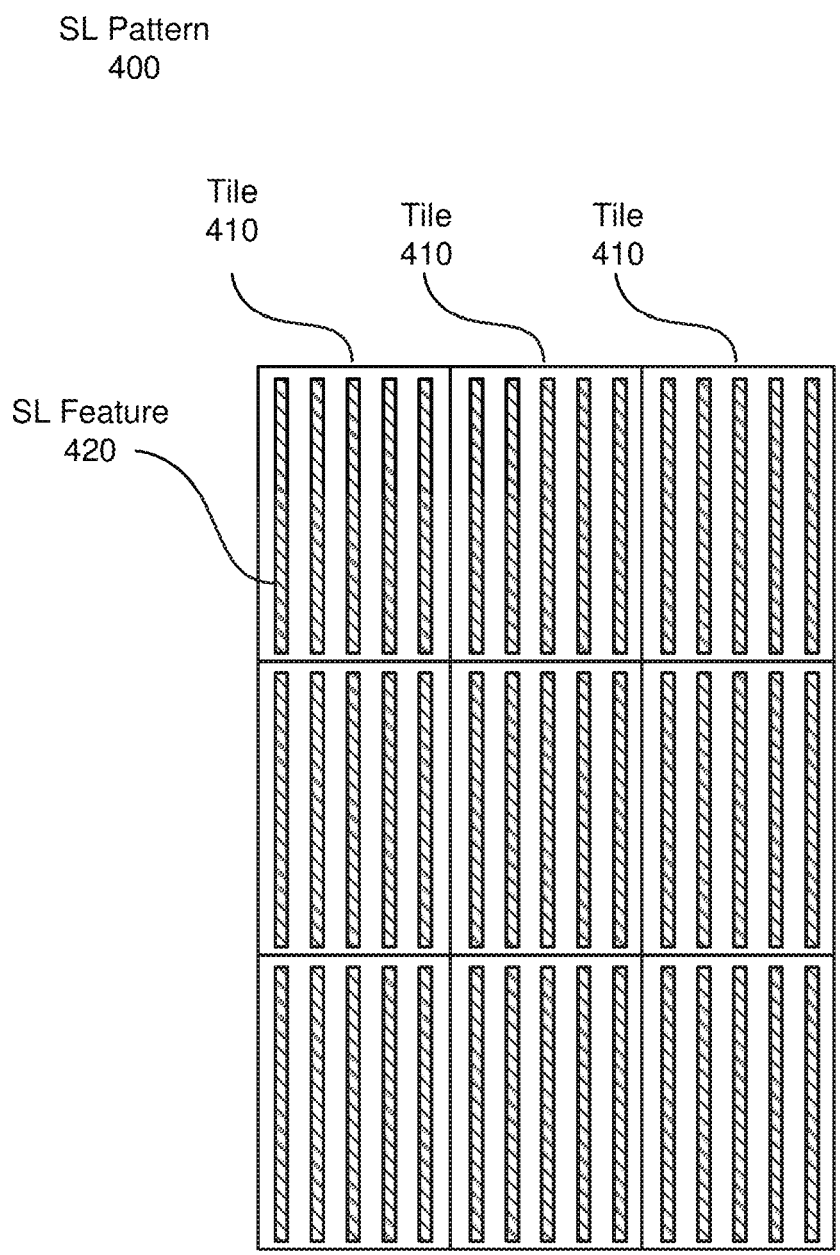
FIG. 4 is a plan view of a quasi-sinusoidal SL pattern, in accordance with one or more embodiments.

FIG. 4 is a plan view of a SL pattern 400 that is projected into a local area of a DCA (e.g., the DCA 200), in accordance with one or more embodiments. The SL pattern 400 may be an embodiment of a SL pattern generated by the illuminator 210 of FIG. 2. The structure light pattern 400 comprises a plurality of tiles 410. The illustrated SL pattern. Each tile 410 comprises a plurality of SL features 420. Each SL feature 420 in a tile 410 may be generated by one of the VCSELs on an illuminator. Each SL feature 420 may be replicated in each tile 410. Thus, the SL pattern in each tile 410 may be replicated in each tile 410 to form the complete SL pattern 400.

The SL pattern 400 may comprise a quasi-sinusoidal pattern. Each SL feature 420 may be in the general shape of a line. The combination of the SL features 420 forms the quasi-sinusoidal pattern. The intensity of the SL pattern 400 in a direction perpendicular to the length of the SL features 420 (i.e., parallel to the x-axis as shown in FIG. 4) varies in a quasi-sinusoidal manner. The intensity may have alternating maxima located along a center of the SL features 420 and minima located between the SL features 420. The intensity may have a gradient between the maxima and the minima. For example, the gradient in the x-direction may be a sine wave, a triangle wave, a gaussian distribution centered on each SL feature 420, some other gradient pattern, or some combination thereof.

The SL pattern 400 may be phase shifted by changing which VCSELs are active on the illuminator. In some embodiments, every third VCSEL in a group of VCSELs is illuminated to generate the SL pattern 400. The SL pattern 400 may be shifted by a fraction of the distance between SL features 420 by switching which VCSELs are illuminated. In some embodiments, the SL pattern 400 may be shifted by one-third of the distance between SL features 420 by switching which VCSELs are illuminated.

Figure 5:
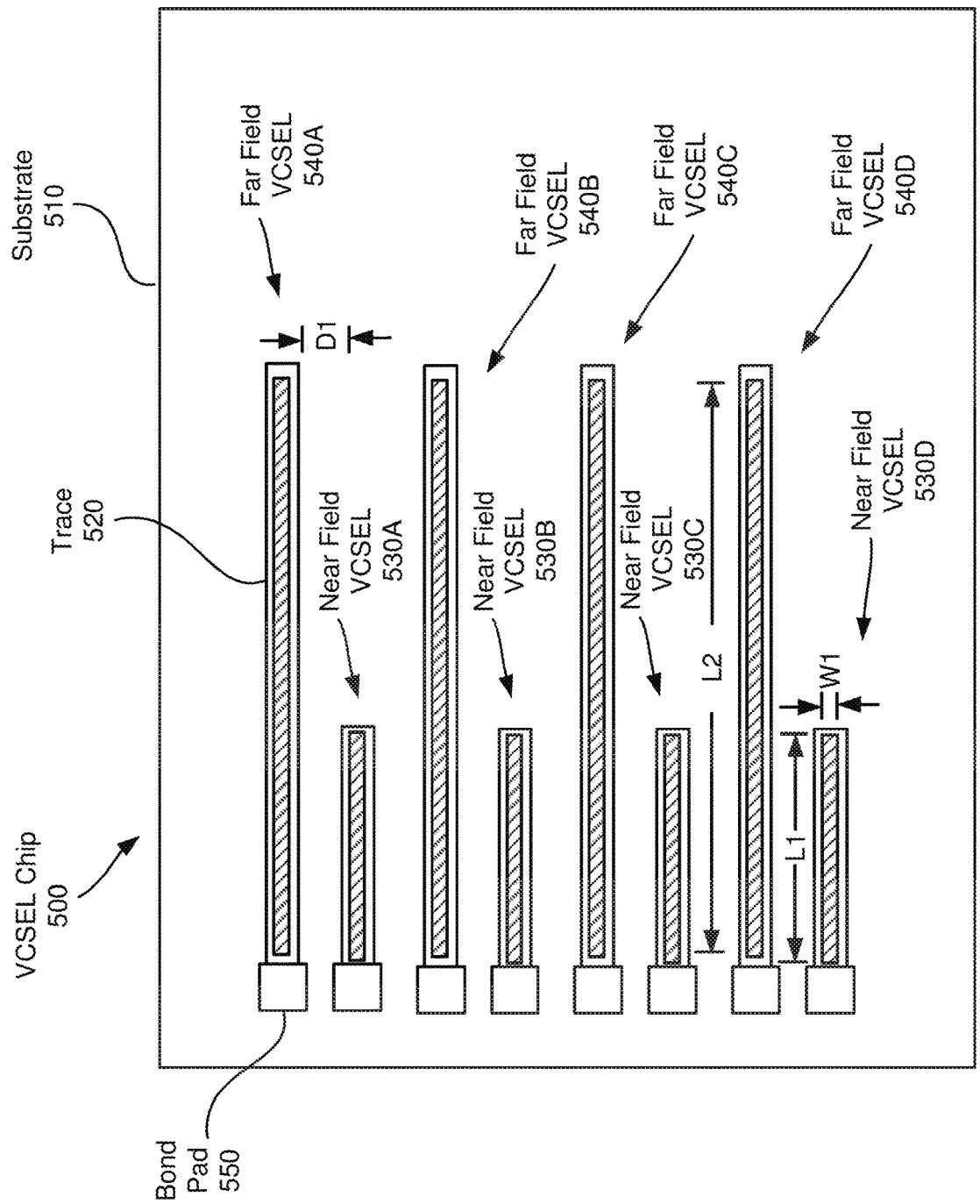
FIG. 5 is a plan view of a VCSEL chip having VCSELs of varying emission lengths, in accordance with one or more embodiments.

FIG. 5 is a plan view of a VCSEL chip 500 having VCSELs of varying lengths of linear emission regions, in accordance with one or more embodiments. The VCSEL chip 500 may be an embodiment of a VCSEL chip of the illuminator 210 of FIG. 2. The VCSEL chip 500 may comprise a substrate 510, a plurality of traces 520, a plurality of near-field VCSELs 530A-D, a plurality of far-field VCSELs 540, and a plurality of bond pads 550.

The substrate 510 is configured to provide a surface on which the various components of the VCSEL chip 500 may be assembled.

The traces 520 are configured to provide an electrical connection to the VCSELs 530A-D, 540A-D. The traces 520 may comprise an electrically conductive material coupled to the substrate 510. In some embodiments, each trace 520 comprises a single VCSEL. In some embodiments, a trace 520 may comprise multiple VCSELs, and an optical assembly may combine the light from the multiple VCSELs on a trace 520 into a single SL feature.

The near-field VCSELs 530A-D are configured to emit light for a SL pattern in the near-field. The near-field VCSELs 530A-D may comprise a linear emission region. As used herein, a "linear emission region" refers to an emission region having a length L1 of greater than five times a width W1. The near-field VCSELs may be parallel to each other.

The far-field VCSELs 540A-D are configured to emit light for a SL pattern in the far-field. The far-field VCSELs 540A-D comprise a length L2 greater than the length L1 of the near-field VCSELs 530A-D. Each far-field VCSEL 540A-D emits light at a greater flux than each near-field VCSEL 530A-D, such that the light from each far-field VCSEL 540A-D is projected by an optical assembly at a greater intensity than the light emitted by a near-field VCSEL 530A-D. The VCSEL chip 500 may comprise any suitable number of different lengths of VCSELs for depth sensing in different regions.

The near-field VCSELs 530A-D and the far-field VCSELs 540A-D may be located in alternating positions on the substrate 510. For example, a first near-field VCSEL 530A is located between a first far-field VCSEL 540A and a second far-field VCSEL 540B.

Each of the VCSELs on the substrate 510 are separated from all other VCSELs by at least a minimum pitch distance. For example, the first far-field VCSEL 540A is separated from the first near-field VCSEL 530A by the distance D1, which is at least the minimum pitch distance. Each of the far-field VCSELs 540A-D may be separated from each other by at least twice the minimum pitch distance plus the width of a near-field VCSEL 530A-D. Each of the near-field VCSELs 530A-D may be separated from each other by at least twice the minimum pitch distance plus the width of a far-field VCSEL 540A-D.

The bond pads 550 are configured to provide an electrical connection between the substrate 510 and the traces 520. The bond pads 550 may comprise an electrically conductive material coupled to the substrate 510. In some embodiments, the bond pads 550 for all VCSELs may be arranged in a straight line with each other.

Figure 6:
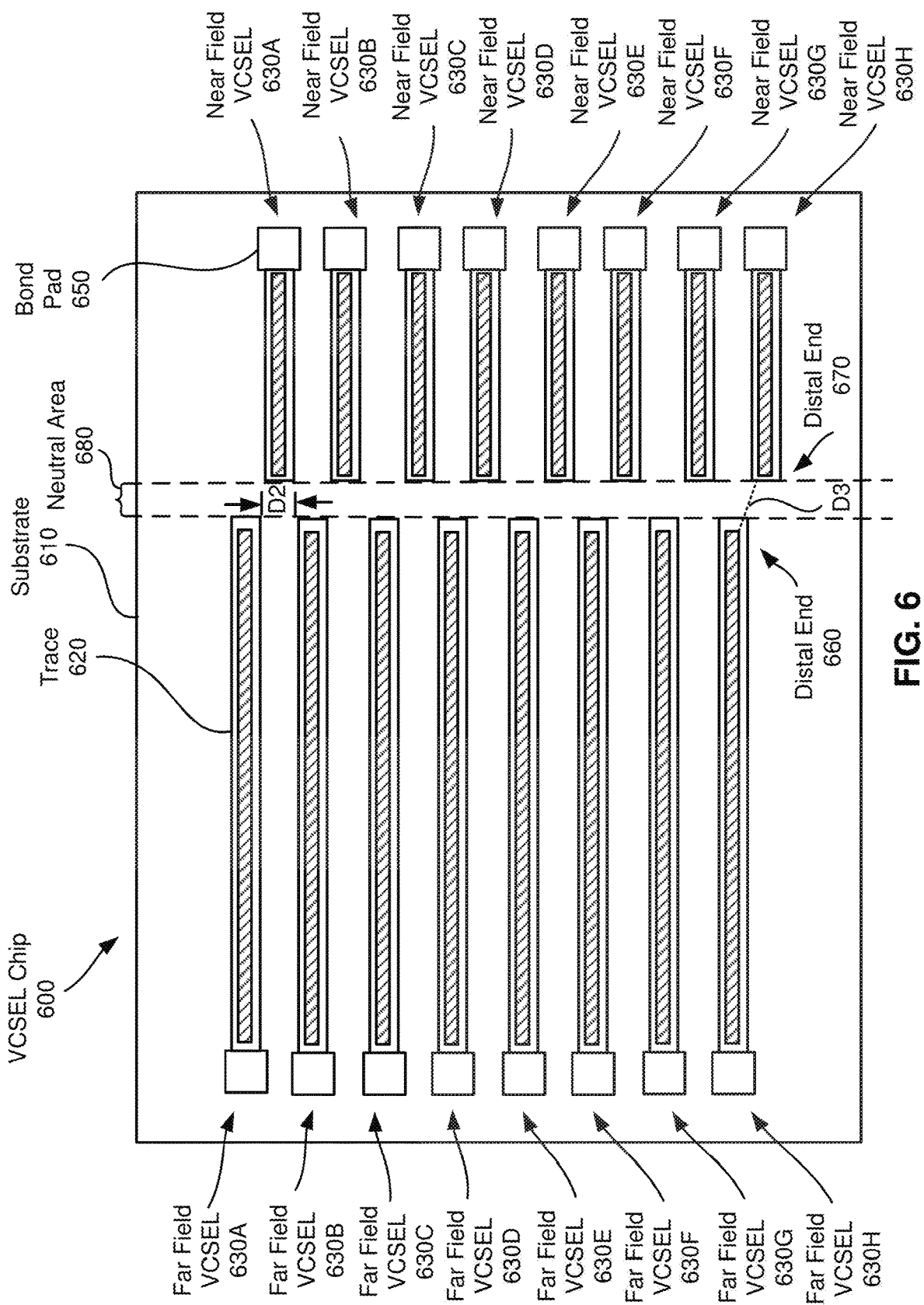
FIG. 6 is a plan view of VCSEL chip having VCSELs of varying emission lengths on different portions of the VCSEL chip, in accordance with one or more embodiments.

FIG. 6 is a plan view of VCSEL chip 600 having VCSELs of varying emission lengths on different portions of the VCSEL chip 600, in accordance with one or more embodiments. The VCSEL chip 600 may an embodiment of a VCSEL chip of the illuminator 210 of FIG. 2. The VCSEL chip 600 may comprise a substrate 610, a plurality of traces 620, a plurality of near-field VCSELs 630A-H, a plurality of far-field VCSELs 640A-H, and a plurality of bond pads 650.

The near-field VCSELs 630 may be located on a first portion of the substrate 610, and the far-field VCSELs 640 may be located on a second portion of the substrate 610. Each of the VCSELs on the substrate 610 are separated from all other VCSELs by at least a minimum pitch distance. For example, a first far-field VCSEL 640A is separated from a second far-field VCSEL 640B by the distance D2, which is at least the minimum pitch distance.

The bond pads 650 are configured to provide an electrical connection between the substrate 610 and the traces 620. The bond pads 650 may comprise an electrically conductive material coupled to the substrate 610. In some embodiments, the bond pads 650 for all of the near-field VCSELs 630 may be arranged in a straight line with each other. In some embodiments, the bond pads 650 for all of the far-field VCSELs 640 may be arranged in a straight line with each other.

Each VCSEL comprises a distal end opposite its respective bond pad 650. The distal end 660 of a far-field VCSEL 640 is separated from a distal end 670 of a near-field VCSEL 630 by a distance D3, which is at least the minimum pitch distance.

The substrate 610 may comprise a neutral area 680 separating the near-field VCSELs 630 from the far-field VCSELs 640. The width of the neutral area 680 may be less than the minimum pitch distance. The near-field VCSELs 630 may be offset from the far-field VCSELs 640 in the direction perpendicular to the length of the VCSELs (y-direction). Thus, the near-field VCSELs 630 are separated from the far-field VCSELs 640 by at least the minimum pitch distance, even though the width of the neutral area 680 may be less than the minimum pitch distance. Thus, the VCSEL chip 600 may have a greater number of VCSELs per unit area of the VCSEL chip 600 in comparison to the VCSEL chip 500 of FIG. 5, while maintaining the minimum pitch distance between VCSELs.

Figure 7A:
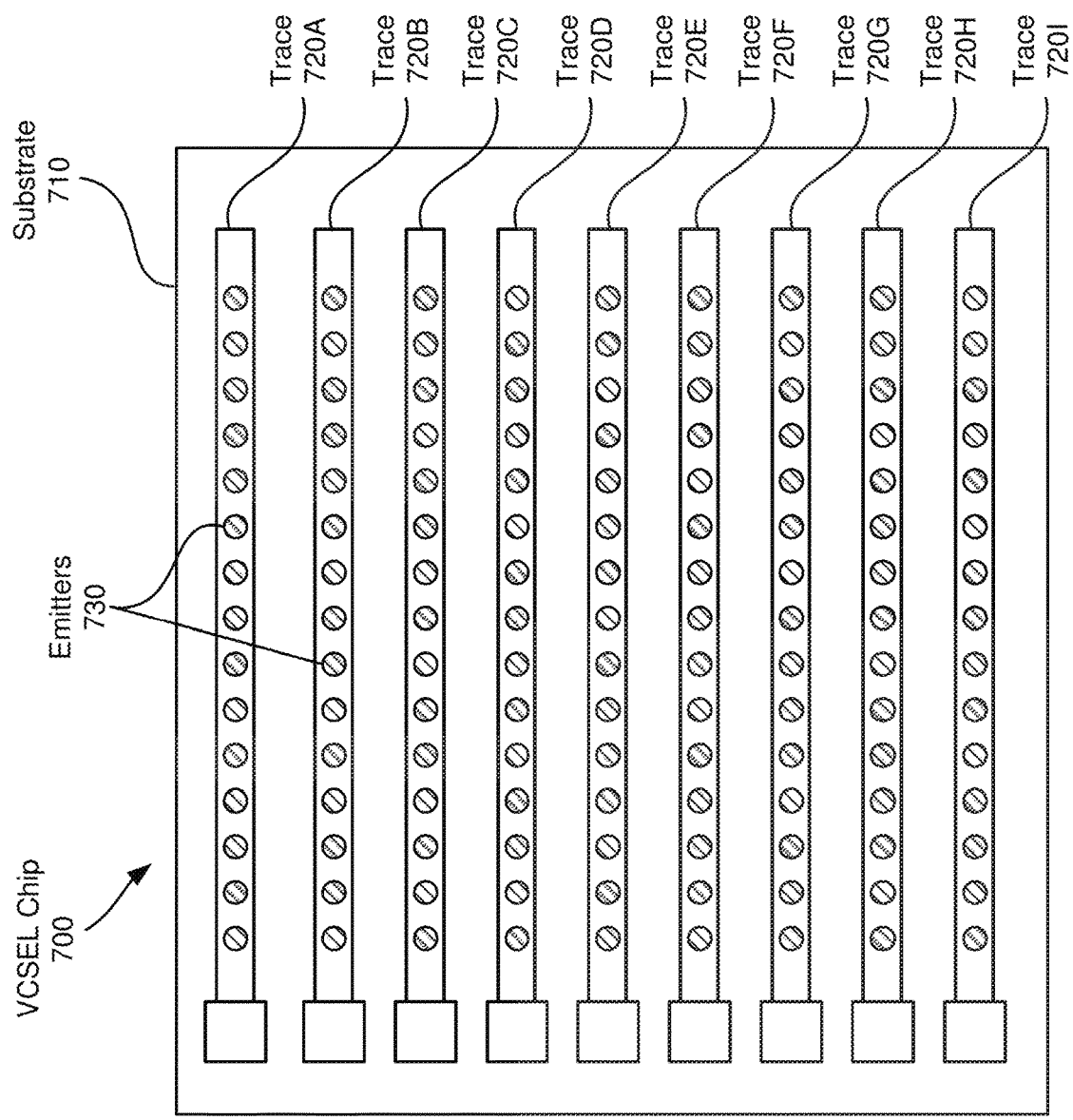
FIG. 7A is a plan view of a VCSEL chip having emitter shapes configured to generate a quasi-sinusoidal pattern, in accordance with one or more embodiments.

FIG. 7A is a plan view of a VCSEL chip 700 having emitter shapes configured to generate a quasi-sinusoidal pattern, in accordance with one or more embodiments. The VCSEL chip 700 is configured to generate a SL pattern comprising lines having a quasi-sinusoidal distribution. The VCSEL chip 700 is configured to phase shift the SL pattern to increase the resolution of a depth sensing system. The VCSEL chip 700 comprises a substrate 710, a plurality of traces 720A-I, and a plurality of emitters 730.

The traces 720A-I are configured to provide an electrical connection to the emitters 730. The traces 720A-I are coupled to the substrate 710. In response to a trace being activated, the trace is configured to transmit power to each emitter on a trace such that the emitters emit light.

The emitters 730 are configured to emit light in a quasi-sinusoidal distribution. The emitters 730 are arranged into groups of emitters, and each group of emitters is on a respective trace 720A-I. As shown, each trace 720A-I comprises a group of fifteen emitters. However, any other suitable number of emitters may be arranged in a group on a trace 720A-I. The group of emitters on a trace 720A-I are configured to emit light together to form a SL feature. The SL features from multiple active traces 720A-I combine to form a quasi-sinusoidal distribution. An optical element in an illuminator may combine the light from each emitter into a line. Each emitter may comprise a shape having a cross-sectional area configured to generate a quasi-sinusoidal distribution, as further described with reference to FIGS. 7B and 7C.

The VCSEL chip 700 is configured to phase shift the quasi-sinusoidal SL pattern. The VCSEL chip 700 may phase shift the quasi-sinusoidal SL pattern by alternating which traces 720A-I are activated. For example, the VCSEL chip 700 may activate a first set of traces comprising every third trace (e.g., traces 720A, 720D, and 720G) during a first time period. The VCSEL chip 700 may phase shift the quasi-sinusoidal SL pattern by 120 degrees by activating a second set of traces comprising every third trace (e.g., traces 720B, 720E, and 720H). The VCSEL chip 700 may phase shift the quasi-sinusoidal SL pattern by 120 degrees again by activating a third set of traces comprising every third trace (e.g., traces 720C, 720F, and 720I). Thus, the VCSEL chip 700 may alternately generate three quasi-sinusoidal SL patterns which are each phase-shifted from one another. Each phase shift results in the quasi-sinusoidal pattern being shifted in the direction perpendicular to the length of the linear SL features. For example, in comparison to traces 720A and 720D being activated together, the VCSEL chip 700 may phase shift the quasi-sinusoidal pattern by 120 degrees one-third of a period) by activating the traces 720B and 720D. In some embodiments, a set of traces may comprise every second trace, every fourth trace, every fifth trace, any other suitable combination of traces, or some combination thereof, such that the quasi-sinusoidal SL patterns may be phase shifted by different amounts.

Figure 7B:
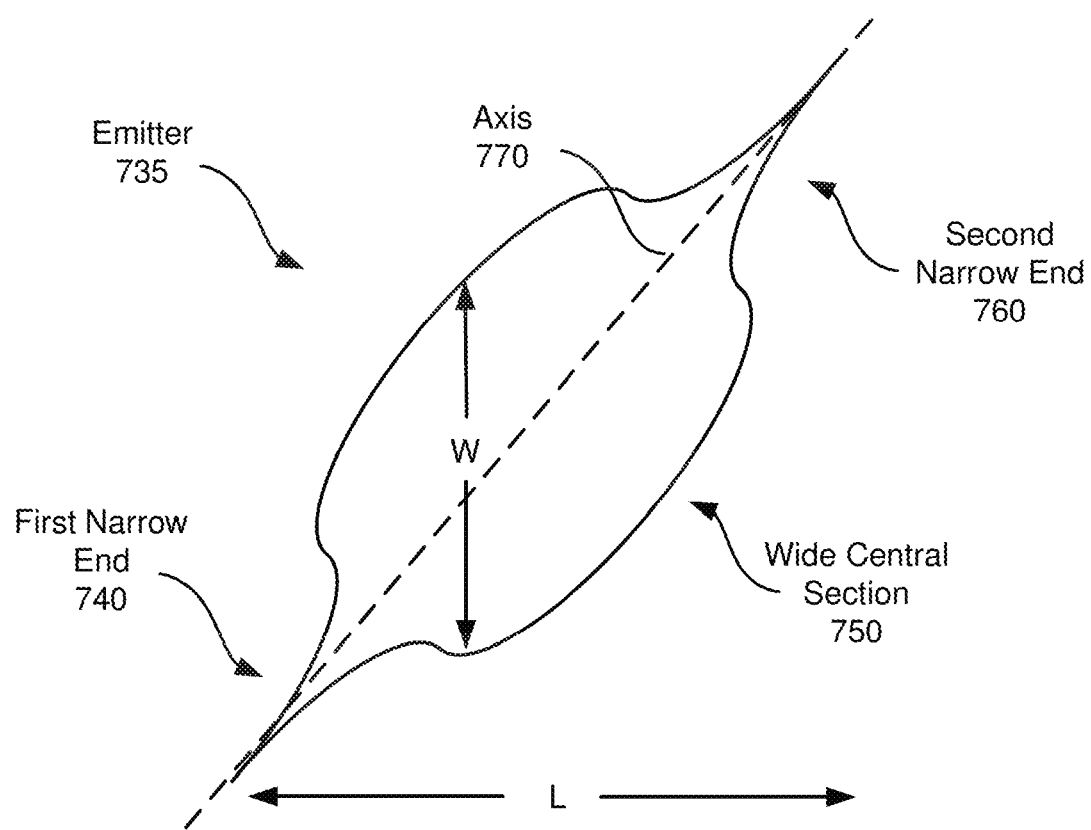
FIG. 7B is a plan view of an emitter of the VCSEL chip of FIG. 7A, in accordance with one or more embodiments.

FIG. 7B is a plan view of an emitter 735, in accordance with one or more embodiments. The emitter 735 may be an embodiment of one of the emitters 730 of FIG. 7A. The emitter 735 is configured to emit light such that the light forms a quasi-sinusoidal distribution in combination with light from emitters in adjacent active traces. The emitter 735 comprises a first narrow end 740, a wide central section 750, and a second narrow end 760. The emitter 735 may be symmetrical about an axis 770. In some embodiments, the axis 770 may be angled at forty-five degrees relative to the length of a trace 720A-I in FIG. 7A. A width W of the emitter 735 varies at different positions across the length L of the emitter 735. The width W varies as a function of the length L in a quasi-sinusoidal distribution.

Figure 7C:
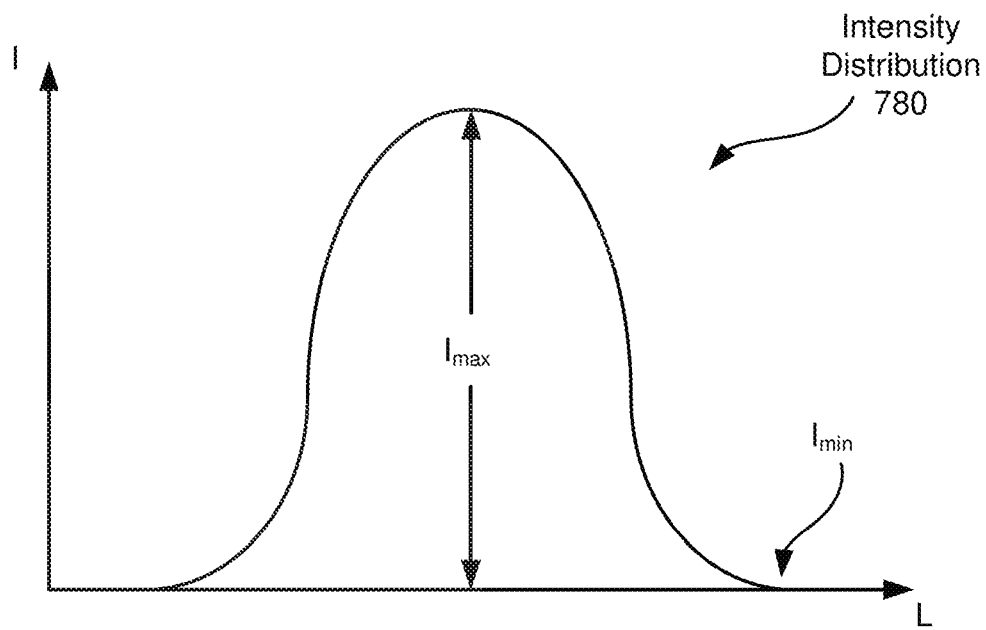
FIG. 7C is an intensity distribution of the emitter of FIG. 7B, in accordance with one or more embodiments.

FIG. 7C is an intensity distribution 780 of the emitter of FIG. 7B, in accordance with one or more embodiments. The intensity distribution 780 shows the intensity I on the y-axis, relative to the position along the length L of the emitter 735 as shown on the x-axis. As shown, the intensity distribution comprises a quasi-sinusoidal distribution having a maxima $I_{max}$, a minima $I_{min}$, and a gradient between the maxima $I_{max}$ and the minima $I_{min}$. The intensity distribution 780 from the emitters on one trace 720A-I may form a line having the intensity distribution 780 when measured perpendicular to the line. The light from multiple active traces 720A-I combines to form the quasi-sinusoidal pattern having multiple maxima and multiple minima in the local area. The intensity distribution 780 forms one period of the quasi-sinusoidal distribution. Activating multiple traces 720A-I on the VCSEL chip 700 may form an intensity distribution having multiple periods of a quasi-sinusoidal distribution.

Figure 8:
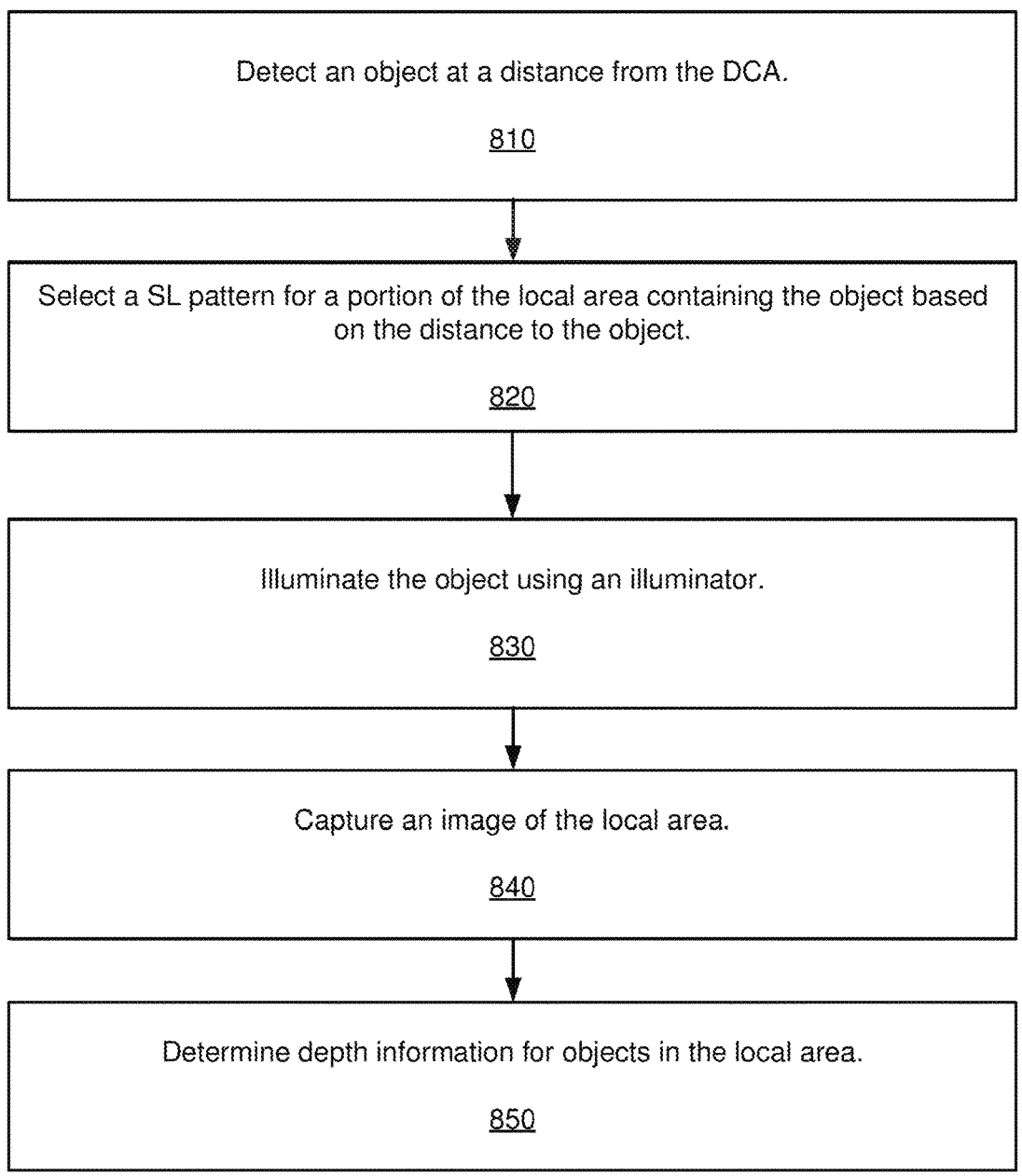
FIG. 8 is a flowchart illustrating a process for generating a SL pattern using emitters with linear emission regions, in accordance with one or more embodiments.

FIG. 8 is a flowchart illustrating a process 800 for generating a SL pattern using emitters with linear emission regions, in accordance with one or more embodiments. The process shown in FIG. 8 may be performed by components of a DCA (e.g., DCA 200 of FIG. 2). Other entities may perform some or all of the steps in FIG. 8 in other embodiments. Embodiments may include different and/or additional steps or perform the steps in different orders.

The DCA detects 810 an object at a distance from the DCA. The DCA may detect objects in the near-field of a local area, the far-field of the local area, or some combination thereof. The DCA may detect the objects using an initial depth sensing mode, such as a TOF depth sensing mode.

The DCA selects 820 a SL pattern for a portion of the local area containing the object based on the distance to the object. For example, in response to the object being located in the near-field, the DCA may select a near-field SL pattern. In response to the object being located in the far-field, the DCA may select a far-field SL pattern.

The DCA illuminates 830 the object using an illuminator. The illuminator may project a SL pattern comprising a plurality of SL features. The SL features may comprise lines. The SL features for the far-field SL pattern may be emitted at a greater intensity than the SL features for the near-field SL pattern. In some embodiments, the SL pattern may comprise a quasi-sinusoidal distribution.

A camera assembly of the DCA captures 840 an image of the local area. The image includes the projected SL pattern in the local areal. The image may be captured in a bandwidth including the bandwidth of the SL pattern, such as in an IR bandwidth.

The DCA determines 850 depth information for objects in the local area. The DCA may identify distortions in the SL pattern in the image captured by the camera assembly. The DCA may apply a depth algorithm to the image to calculate a depth for each pixel of a sensor of a camera of a depth camera assembly.

Figure 9:
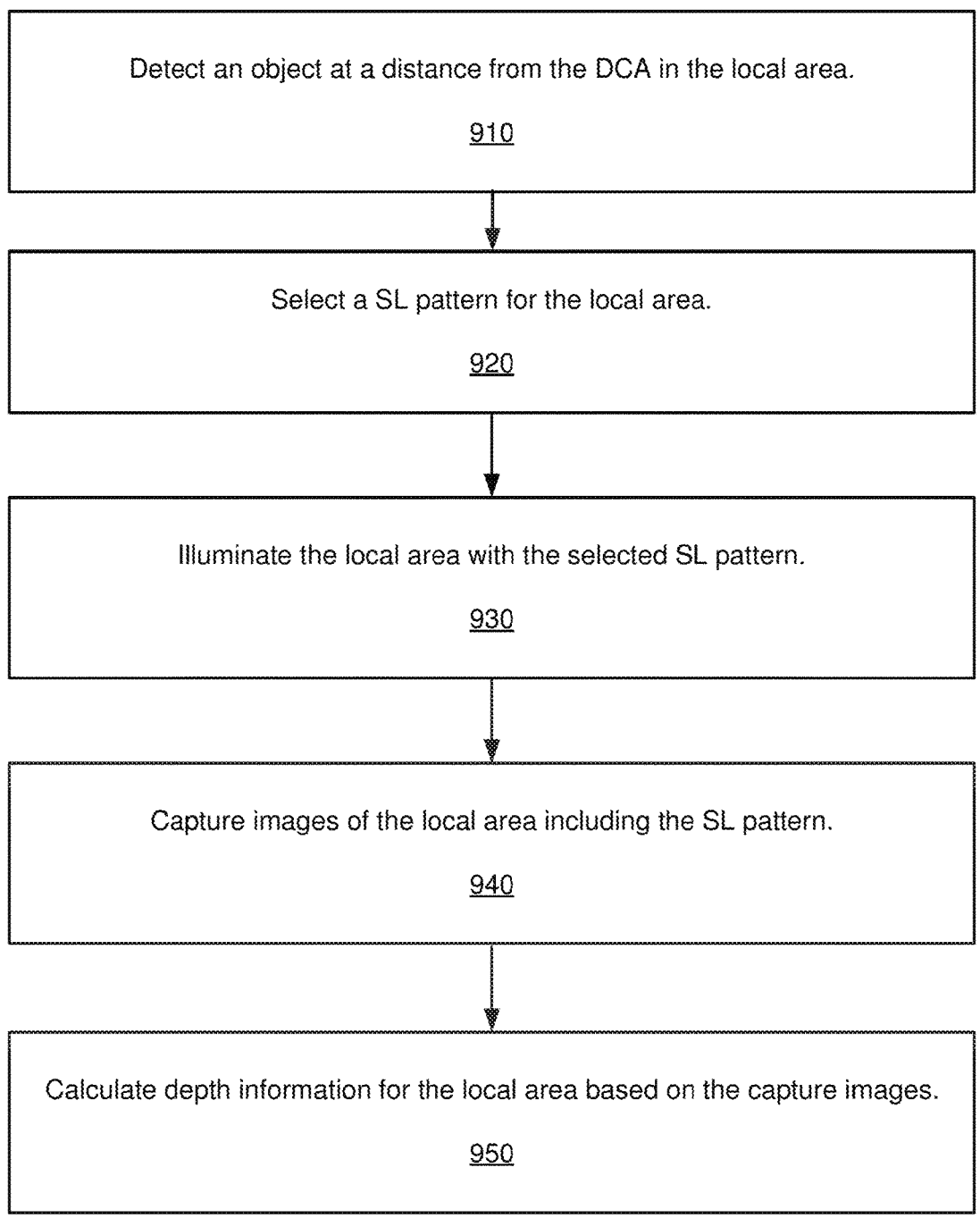
FIG. 9 is a flowchart illustrating a process for generating a quasi-sinusoidal SL pattern, in accordance with one or more embodiments.

FIG. 9 is a flowchart illustrating a process 900 for generating a quasi-sinusoidal SL pattern, in accordance with one or more embodiments. The process shown in FIG. 9 may be performed by components of a DCA (e.g., DCA 200 of FIG. 2). Other entities may perform some or all of the steps in FIG. 9 in other embodiments. Embodiments may include different and/or additional steps or perform the steps in different orders.

The DCA detects 910 an object at a distance from the DCA in the local area. In some embodiments, the DCA may detect multiple objects at multiple distances from the DCA. The DCA may detect the distance using any suitable depth sensing mode.

The DCA selects 920 a SL pattern for the local area. The SL pattern may be selected based on a distance to the object. In some embodiments, the SL pattern may comprise a quasi-sinusoidal SL pattern. The DCA may determine that multiple phase shifted quasi-sinusoidal SL patterns should be used in succession.

The DCA illuminates 930 the local area with the selected SL pattern. The DCA may activate a first set of traces on a VCSEL chip. Each trace may comprise a plurality of emitters configured to generate a quasi-sinusoidal distribution. The first set of traces may comprise every third trace on the VCSEL chip. The DCA may generate a second quasi-sinusoidal SL pattern. The second quasi-sinusoidal SL pattern is phase-shifted relative to the first quasi-sinusoidal SL pattern. The DCA may activate a second set of traces on the VCSEL chip to generate the second quasi-sinusoidal SL pattern. The DCA may generate a third quasi-sinusoidal SL pattern. The third quasi-sinusoidal SL pattern is phase-shifted relative to the first and second quasi-sinusoidal SL patterns. The DCA may activate a third set of traces on the VCSEL chip to generate the third quasi-sinusoidal SL pattern.

The DCA captures 940 images of the local area including the SL pattern. The DCA may capture one or more images of the local area including each phase of the quasi-sinusoidal SL pattern until all selected phase shifts are completed.

The DCA calculates 950 depth information for the local area based on the captured images. The DCA may utilize a SL depth sensing mode to calculate the depth information based on distortions of the SL pattern in the images captured by the DCA.

Figure 10:
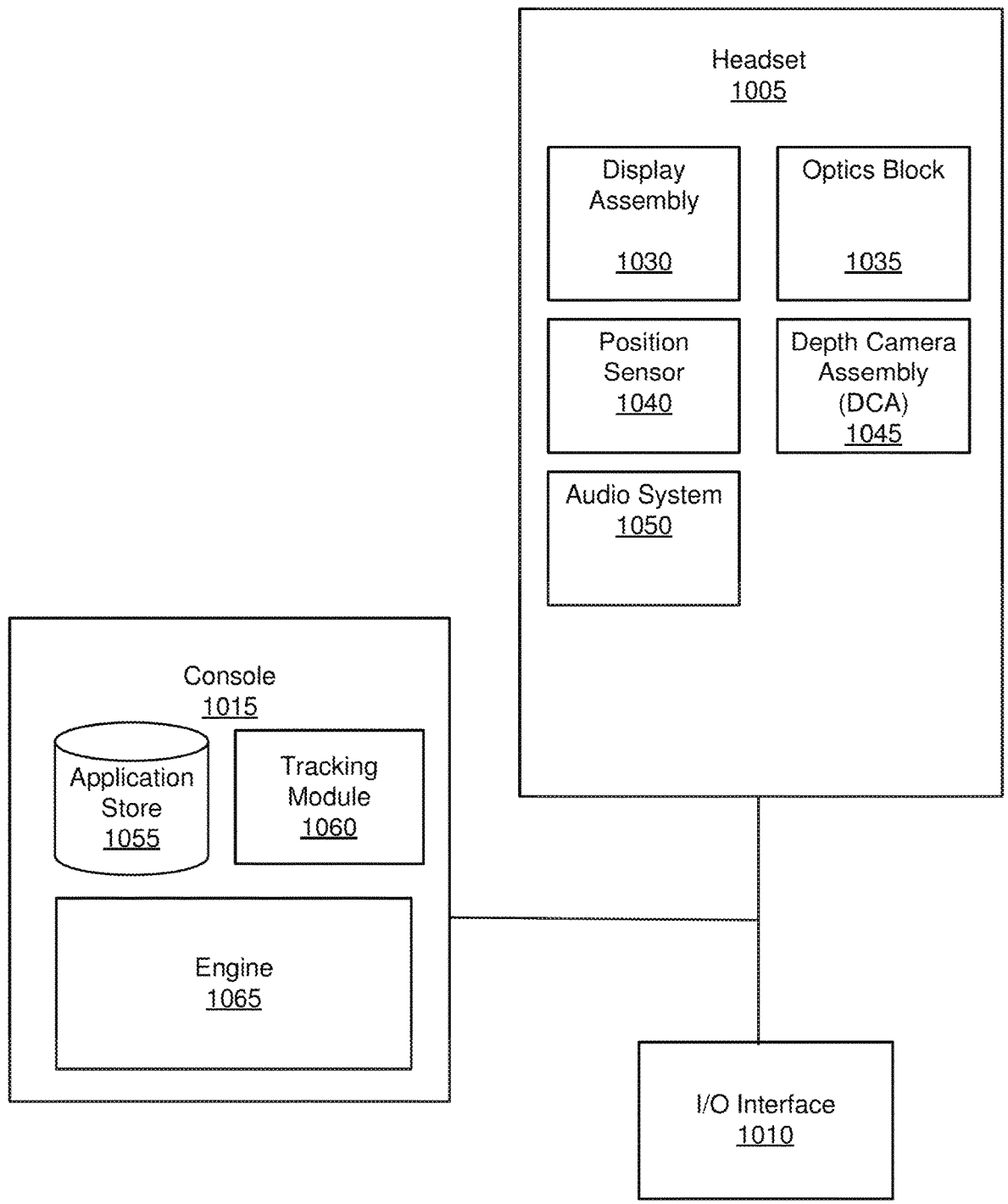
FIG. 10 is a system that includes a headset, in accordance with one or more embodiments.

FIG. 10 is a system 1000 that includes a headset 1005, in accordance with one or more embodiments. In some embodiments, the headset 1005 may be the headset 100 of FIG. 1A or the headset 105 of FIG. 1B. The system 1000 may operate in an artificial reality environment (e.g., a virtual reality environment, an augmented reality environment, a mixed reality environment, or some combination thereof). The system 1000 shown by FIG. 10 includes the headset 1005 and an input/output (I/O) interface 1010 that is coupled to a console 1015. While FIG. 10 shows an example system 1000 including one headset 1005 and one I/O interface 1010, in other embodiments any number of these components may be included in the system 1000. For example, there may be multiple headsets each having an associated I/O interface 1010, with each headset and I/O interface 1010 communicating with the console 1015. In alternative configurations, different and/or additional components may be included in the system 1000. Additionally, functionality described in conjunction with one or more of the components shown in FIG. 10 may be distributed among the components in a different manner than described in conjunction with FIG. 10 in some embodiments. For example, some or all of the functionality of the console 1015 may be provided by the headset 1005.

The headset 1005 includes the display assembly 1030, an optics block 1035, one or more position sensors 1040, and the DCA 1045. Some embodiments of headset 1005 have different components than those described in conjunction with FIG. 10. Additionally, the functionality provided by various components described in conjunction with FIG. 10 may be differently distributed among the components of the headset 1005 in other embodiments or be captured in separate assemblies remote from the headset 1005.

The display assembly 1030 displays content to the user in accordance with data received from the console 1015. The display assembly 1030 displays the content using one or more display elements (e.g., the display elements 120). A display element may be, e.g., an electronic display. In various embodiments, the display assembly 1030 comprises a single display element or multiple display elements (e.g., a display for each eye of a user). Examples of an electronic display include: a liquid crystal display (LCD), an organic light emitting diode (OLED) display, an active-matrix organic light-emitting diode display (AMOLED), a waveguide display, some other display, or some combination thereof. Note in some embodiments, the display element 120 may also include some or all of the functionality of the optics block 1035.

The optics block 1035 may magnify image light received from the electronic display, corrects optical errors associated with the image light, and presents the corrected image light to one or both eyeboxes of the headset 1005. In various embodiments, the optics block 1035 includes one or more optical elements. Example optical elements included in the optics block 1035 include: an aperture, a Fresnel lens, a convex lens, a concave lens, a filter, a reflecting surface, or any other suitable optical element that affects image light. Moreover, the optics block 1035 may include combinations of different optical elements. In some embodiments, one or more of the optical elements in the optics block 1035 may have one or more coatings, such as partially reflective or anti-reflective coatings.

Magnification and focusing of the image light by the optics block 1035 allows the electronic display to be physically smaller, weigh less, and consume less power than larger displays. Additionally, magnification may increase the field of view of the content presented by the electronic display. For example, the field of view of the displayed content is such that the displayed content is presented using almost all (e.g., approximately 110 degrees diagonal), and in some cases, all of the user's field of view. Additionally, in some embodiments, the amount of magnification may be adjusted by adding or removing optical elements.

In some embodiments, the optics block 1035 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display for display is pre-distorted, and the optics block 1035 corrects the distortion when it receives image light from the electronic display generated based on the content.

The position sensor 1040 is an electronic device that generates data indicating a position of the headset 1005. The position sensor 1040 generates one or more measurement signals in response to motion of the headset 1005. The position sensor 190 is an embodiment of the position sensor 1040. Examples of a position sensor 1040 include: one or more IMUs, one or more accelerometers, one or more gyroscopes, one or more magnetometers, another suitable type of sensor that detects motion, or some combination thereof. The position sensor 1040 may include multiple accelerometers to measure translational motion (forward/back, up/down, left/right) and multiple gyroscopes to measure rotational motion (e.g., pitch, yaw, roll). In some embodiments, an IMU rapidly samples the measurement signals and calculates the estimated position of the headset 1005 from the sampled data. For example, the IMU integrates the measurement signals received from the accelerometers over time to estimate a velocity vector and integrates the velocity vector over time to determine an estimated position of a reference point on the headset 1005. The reference point is a point that may be used to describe the position of the headset 1005. While the reference point may generally be defined as a point in space, however, in practice the reference point is defined as a point within the headset 1005.

The DCA 1045 generates depth information for a portion of the local area. The DCA 1045 may be an embodiment of the DCA 200 of FIG. 2. The DCA includes one or more imaging devices and a DCA controller. The DCA 1045 also includes an illuminator. The DCA 1045 may be configured to generate different SL patterns for depth sensing in the near-field and depth sensing in the far-field. The different SL patterns may be generated by activating different VCSELs of the illuminator. The DCA 1045 may be configured to generate a quasi-sinusoidal SL pattern which may be phase-shifted by activating different VCSELs of the illuminator. Operation and structure of the DCA 1045 is described above primarily with regard to FIG. 2.

The audio system 1050 provides audio content to a user of the headset 1005. The audio system 1050 may comprise one or acoustic sensors, one or more transducers, and an audio controller. The audio system 1050 may provide spatialized audio content to the user. In some embodiments, the audio system may request acoustic parameters from a mapping server. The acoustic parameters describe one or more acoustic properties (e.g., room impulse response, a reverberation time, a reverberation level, etc.) of the local area. The audio system 1050 may provide information describing at least a portion of the local area from e.g., the DCA 1045 and/or location information for the headset 1005 from the position sensor 1040. The audio system 1050 may generate one or more sound filters using one or more of the acoustic parameters and use the sound filters to provide audio content to the user.

The I/O interface 1010 is a device that allows a user to send action requests and receive responses from the console 1015. An action request is a request to perform a particular action. For example, an action request may be an instruction to start or end capture of image or video data, or an instruction to perform a particular action within an application. The I/O interface 1010 may include one or more input devices. Example input devices include: a keyboard, a mouse, a game controller, or any other suitable device for receiving action requests and communicating the action requests to the console 1015. An action request received by the I/O interface 1010 is communicated to the console 1015, which performs an action corresponding to the action request. In some embodiments, the I/O interface 1010 includes an IMU that captures calibration data indicating an estimated position of the I/O interface 1010 relative to an initial position of the I/O interface 1010. In some embodiments, the I/O interface 1010 may provide haptic feedback to the user in accordance with instructions received from the console 1015. For example, haptic feedback is provided when an action request is received, or the console 1015 communicates instructions to the I/O interface 1010 causing the I/O interface 1010 to generate haptic feedback when the console 1015 performs an action.

The console 1015 provides content to the headset 1005 for processing in accordance with information received from one or more of: the DCA 1045, the headset 1005, and the I/O interface 1010. In the example shown in FIG. 10, the console 1015 includes an application store 1055, a tracking module 1060, and an engine 1065. Some embodiments of the console 1015 have different modules or components than those described in conjunction with FIG. 10. Similarly, the functions further described below may be distributed among components of the console 1015 in a different manner than described in conjunction with FIG. 10. In some embodiments, the functionality discussed herein with respect to the console 1015 may be implemented in the headset 1005, or a remote system.

The application store 1055 stores one or more applications for execution by the console 1015. An application is a group of instructions, that when executed by a processor, generates content for presentation to the user. Content generated by an application may be in response to inputs received from the user via movement of the headset 1005 or the I/O interface 1010. Examples of applications include: gaming applications, conferencing applications, video playback applications, or other suitable applications.

The tracking module 1060 tracks movements of the headset 1005 or of the I/O interface 1010 using information from the DCA 1045, the one or more position sensors 1040, or some combination thereof. For example, the tracking module 1060 determines a position of a reference point of the headset 1005 in a mapping of a local area based on information from the headset 1005. The tracking module 1060 may also determine positions of an object or virtual object. Additionally, in some embodiments, the tracking module 1060 may use portions of data indicating a position of the headset 1005 from the position sensor 1040 as well as representations of the local area from the DCA 1045 to predict a future location of the headset 1005. The tracking module 1060 provides the estimated or predicted future position of the headset 1005 or the I/O interface 1010 to the engine 1065.

The engine 1065 executes applications and receives position information, acceleration information, velocity information, predicted future positions, or some combination thereof, of the headset 1005 from the tracking module 1060. Based on the received information, the engine 1065 determines content to provide to the headset 1005 for presentation to the user. For example, if the received information indicates that the user has looked to the left, the engine 1065 generates content for the headset 1005 that mirrors the user's movement in a virtual local area or in a local area augmenting the local area with additional content. Additionally, the engine 1065 performs an action within an application executing on the console 1015 in response to an action request received from the I/O interface 1010 and provides feedback to the user that the action was performed. The provided feedback may be visual or audible feedback via the headset 1005 or haptic feedback via the I/O interface 1010.

A network couples the headset 1005 and/or the console 1015 to external systems. The network may include any combination of local area and/or wide area networks using both wireless and/or wired communication systems. For example, the network may include the Internet, as well as mobile telephone networks. In one embodiment, the network uses standard communications technologies and/or protocols. Hence, the network may include links using technologies such as Ethernet, 802.11, worldwide interoperability for microwave access (WiMAX), 2G/3G/4G mobile communications protocols, digital subscriber line (DSL), asynchronous transfer mode (ATM), InfiniBand, PCI Express Advanced Switching, etc. Similarly, the networking protocols used on the network can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), etc. The data exchanged over the network can be represented using technologies and/or formats including image data in binary form Portable Network Graphics (PNG)), hypertext markup language (HTML), extensible markup language (XML), etc. In addition, all or some of links can be encrypted using conventional encryption technologies such as secure sockets layer (SSL), transport layer security (TLS), virtual private networks (VPNs), Internet Protocol security (IPsec), etc.

One or more components of system 1000 may contain a privacy module that stores one or more privacy settings for user data elements. The user data elements describe the user or the headset 1005. For example, the user data elements may describe a physical characteristic of the user, an action performed by the user, a location of the user of the headset 1005, a location of the headset 1005, an HRTF for the user, etc. Privacy settings (or "access settings") for a user data element may be stored in any suitable manner, such as, for example, in association with the user data element, in an index on an authorization server, in another suitable manner, or any suitable combination thereof.

A privacy setting for a user data element specifies how the user data element (or particular information associated with the user data element) can be accessed, stored, or otherwise used (e.g., viewed, shared, modified, copied, executed, surfaced, or identified). In some embodiments, the privacy settings for a user data element may specify a "blocked list" of entities that may not access certain information associated with the user data element. The privacy settings associated with the user data element may specify any suitable granularity of permitted access or denial of access. For example, some entities may have permission to see that a specific user data element exists, some entities may have permission to view the content of the specific user data element, and some entities may have permission to modify the specific user data element. The privacy settings may allow the user to allow other entities to access or store user data elements for a finite period of time.

The privacy settings may allow a user to specify one or more geographic locations from which user data elements can be accessed. Access or denial of access to the user data elements may depend on the geographic location of an entity who is attempting to access the user data elements. For example, the user may allow access to a user data element and specify that the user data element is accessible to an entity only while the user is in a particular location. If the user leaves the particular location, the user data element may no longer be accessible to the entity. As another example, the user may specify that a user data element is accessible only to entities within a threshold distance from the user, such as another user of a headset within the same local area as the user. If the user subsequently changes location, the entity with access to the user data element may lose access, while a new group of entities may gain access as they come within the threshold distance of the user.

The system 1000 may include one or more authorization/privacy servers for enforcing privacy settings. A request from an entity for a particular user data element may identify the entity associated with the request and the user data element may be sent only to the entity if the authorization server determines that the entity is authorized to access the user data element based on the privacy settings associated with the user data element. If the requesting entity is not authorized to access the user data element, the authorization server may prevent the requested user data element from being retrieved or may prevent the requested user data element from being sent to the entity. Although this disclosure describes enforcing privacy settings in a particular manner, this disclosure contemplates enforcing privacy settings in any suitable manner.

Additional Configuration Information

The foregoing description of the embodiments has been presented for illustration; it is not intended to be exhaustive or to limit the patent rights to the precise forms disclosed. Persons skilled in the relevant art can appreciate that many modifications and variations are possible considering the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A vertical cavity surface emitting laser (VCSEL) array comprising:
   one or more first linear VCSELs on a substrate, each of the one or more first linear VCSELs having a respective linear emission region over a first length; and
   one or more second linear VCSELs on the substrate, each of the one or more second linear VCSELs having a linear emission region over a second length that is longer than the first length, wherein
   the linear emission region of at least one second linear VCSEL of the one or more second linear VCSELs is parallel to an adjacent linear emission region of a respective first linear VCSEL of the one or more first linear VCSELs,
   the respective first linear VCSEL is configured to generate a first structured light pattern for illumination of a near-field portion of a local area serviced by the VCSEL array, and
   the one or more second linear VCSEL is configured to generate a second structured light pattern for illumination of a far-field portion of the local area.

2. The VCSEL array of claim 1, wherein:
   the one or more first linear VCSELs are positioned on a first portion of the substrate;
   the one or more second linear VCSELs are positioned on a second portion of the substrate; and
   the first portion of the substrate and the second portion of the substrate are separated by a neutral portion.

3. The VCSEL array of claim 2, wherein a width of the neutral portion is less than a minimum pitch distance between adjacent VCSELs.

4. The VCSEL array of claim 1, wherein the one or more first linear VCSELs are separated from the one or more second linear VCSELs by a minimum pitch distance.

5. The VCSEL array of claim 4, wherein:
   a first linear VCSEL of the one or more first linear VCSELs is positioned between two linear VCSELs of the one or more second linear VCSELs, and
   the first linear VCSEL of the one or more first linear VCSELs is separated from each of the two linear VCSELs of the one or more second linear VCSELs by at least the minimum pitch distance.

6. The VCSEL array of claim 1, wherein a flux of light emitted by the one or more first linear VCSELs and the one or more second linear VCSELs is proportional to a length of a respective VCSEL.

7. The VCSEL array of claim 1, wherein each of the one or more first linear VCSELs is parallel to each of the one or more second linear VCSELs.

8. The VCSEL array of claim 1, wherein the one or more first linear VCSELs are configured to be activated by a depth camera assembly controller in response to the depth camera assembly controller detecting an object in the near-field portion of the local area serviced by the VCSEL array.

9. The VCSEL array of claim 1, wherein the VCSEL array is configured to phase shift a structured light pattern generated by the VCSEL array.

10. A vertical cavity surface emitting laser (VCSEL) array comprising:
    a first plurality of emitters each having an emission region of a first shape, wherein the first plurality of emitters are positioned on a substrate to emit light that forms a structured light (SL) pattern at a first phase shift in a far-field of the VCSEL array, and wherein the SL pattern has a quasi-sinusoidal distribution in at least one dimension that is based in part on positions of the first plurality of emitters on the substrate and the first shape of each emission region of each of the first plurality of emitters; and
    a second plurality of emitters each having an emission region of the first shape, wherein the second plurality of emitters are positioned on the substrate to emit light that forms the SL pattern in the far-field at a second phase shift that is different than the first phase shift, and the quasi-sinusoidal distribution of the SL pattern at the second phase shift is based in part on positions of the second plurality of emitters on the substrate and the first shape of each emission region of each of the second plurality of emitters.

11. The VCSEL array of claim 10, further comprising a third plurality of emitters each having an emission region of the first shape, wherein the third plurality of emitters are positioned on the substrate to emit light that forms the SL pattern in the far-field at a third phase shift that is different than the first phase shift, and the quasi-sinusoidal distribution of the SL pattern at the third phase shift is based in part on positions of the second plurality of emitters on the substrate and the first shape of each emission region of each of the third plurality of emitters.

12. The VCSEL array of claim 10, wherein the VCSEL array is configured to activate the first plurality of emitters during a first time period, and wherein the VCSEL array is configured to activate the second plurality of emitters during a second time period.

13. The VCSEL array of claim 10, wherein a width of the first shape varies as a function of a position along a length of the first shape.

14. The VCSEL array of claim 10, wherein the first plurality of emitters comprises a first group of emitters on a first plurality of traces and the second plurality of emitters comprises a second group of emitters on a second plurality of traces.

15. The VCSEL array of claim 14, further comprising a third plurality of emitters comprising a third group of emitters on a third plurality of traces.

16. The VCSEL array of claim 15, wherein one of the third plurality of traces is positioned between one of the first plurality of traces and one of the second plurality of traces.

17. The VCSEL array of claim 10, wherein the first shape is symmetrical about an axis, wherein the axis is non-parallel to a trace comprising a first group of the first plurality of emitters.

18. The VCSEL array of claim 10, wherein the first shape comprises a first narrow end, a wide central section, and a second narrow end.

19. The VCSEL array of claim 10, wherein the first shape is non-circular.

* * * * *